(12) United States Patent
Brant et al.

(10) Patent No.: US 7,197,617 B2
(45) Date of Patent: Mar. 27, 2007

(54) PROCESS, APPARATUS, AND SYSTEM FOR STORING DATA CHECK INFORMATION USING STANDARD SECTOR DATA FIELD SIZES

(75) Inventors: William Alexander Brant, Boulder, CO (US); Michael Edward Nielson, Broomfield, CO (US); Noel Simen Otterness, Lafayette, CO (US); Thomas Elkins Richardson, Golden, CO (US)

(73) Assignee: International Business Machines Corporation, Armonk, NY (US)

( * ) Notice: Subject to any disclaimer, the term of this patent is extended or adjusted under 35 U.S.C. 154(b) by 291 days.

(21) Appl. No.: 10/447,843

(22) Filed: May 29, 2003

(65) Prior Publication Data

US 2004/0243762 A1 Dec. 2, 2004

(51) Int. Cl.
*G06F 12/00* (2006.01)
(52) U.S. Cl. .................. 711/170; 711/112; 714/758
(58) Field of Classification Search .............. 711/114, 711/111, 170, 112; 710/74, 65; 714/758
See application file for complete search history.

(56) References Cited

U.S. PATENT DOCUMENTS

| | | | | |
|---|---|---|---|---|
| 5,666,335 | A | 9/1997 | Horibe | 369/32 |
| 6,269,464 | B1* | 7/2001 | Boussina et al. | 714/752 |
| 6,324,604 | B1* | 11/2001 | Don et al. | 710/74 |
| 6,480,970 | B1* | 11/2002 | DeKoning et al. | 714/6 |
| 6,684,289 | B1* | 1/2004 | Gonzalez et al. | 711/103 |
| 2002/0124137 | A1* | 9/2002 | Ulrich et al. | 711/113 |
| 2002/0161972 | A1* | 10/2002 | Talagala et al. | 711/114 |
| 2005/0071553 | A1* | 3/2005 | Mannen et al. | 711/114 |

FOREIGN PATENT DOCUMENTS

JP         8171462        7/1996

OTHER PUBLICATIONS

"Microsoft Computer Dictionary," Fifth Edition, Microsoft Press, 2002, pp. 133.*
"Performance Efficient Multiple Logical Unit Number Mapping for Redundant Array of Independent Disks", IBM Technical Disclosure Bulletin, vol. 39, No. 5, May 1996, pp. 273-274.

* cited by examiner

*Primary Examiner*—Pierre Bataille
*Assistant Examiner*—Shane M. Thomas
(74) *Attorney, Agent, or Firm*—Kunzler & Associates (57) ABSTRACT

A process, apparatus, and system stores data check information on an electronic storage medium that uses standard sector data field sizes. The check information may include a cyclic redundancy check (CRC), a logical block address (LBA), a longitudinal redundancy check (LRC), state information, a sequence number, or other information to identify data state, misplacement, or corruption. The check information, instead of being appended to the data within the data sector, may be stored in an independent check sector. The check information corresponding to multiple data sectors may also be aggregated and stored in a single check sector. The process or apparatus may be incorporated in a storage system controller, a RAID controller, a software SCSI stack in a computer, an operating system, a storage device driver, or another appropriate application that interfaces with standard and commodity storage system components.

21 Claims, 7 Drawing Sheets

PROCESS, APPARATUS, AND SYSTEM FOR STORING DATA CHECK INFORMATION USING STANDARD SECTOR DATA FIELD SIZES

BACKGROUND OF THE INVENTION

1. Field of the Invention

The present invention relates to the field of data storage on electronic storage devices and more particularly to storing check information for stored data on an electronic storage medium using standard sector data field sizes.

2. Description of Related Art

As the storage capacity of electronic storage media continues to increase and the data processing techniques and speeds continue to develop, the potential for data errors subsequently increases. The increased potential for data errors due to the significant increase in the amount of data processed and the complexity of the processing software and hardware may potentially lead to more severe problems when a data error does occur. For this reason, many high-end data storage systems incorporate a variety of error checking procedures and safeguards to detect and even correct data errors that may occur.

One way in which data storage systems have been designed to minimize the potential for data errors is through the use of data structures that are binary multiples, such $2^1$, $2^2$, $2^3$, $2^4$, etc., in data processing and hardware design. In particular, it is common for hard disk drive manufacturers to format magnetic disk surfaces into sectors including data fields of 512 bytes ($2^9$ bytes) each. By using a storage size that is a binary multiple, the computation and processing required is minimized, thereby minimizing the potential for data errors in the processing stages and data storage operations.

Another approach to minimizing the potential for data errors in data storage systems is through the employment of data detection and data correction schemes. Each time data is transferred among the various electronic components of the system, an error detection scheme may be employed to detect a potential error in the transferred data. If an error is detected, the system may try to transfer the correct data again, or may possibly try to correct the transferred data using one or more error correction techniques. These error detection and error correction schemes typically involve the calculation and processing of one or more identifiers determined by the particular scheme employed.

These identifiers and general check information typically must be stored near and transferred with the requested data so that it is available at the time of error checking. When data and an associated identifier are transferred, the system may use error checking to verify that the data has not been corrupted and that the data was stored in and accessed from the correct storage location.

One manner in which this check information, including one or more error detection and correction identifiers, has been stored near the requested data is by appending the check information to the data field of the storage sector in which the data is stored. When a system requests a particular set of data and accesses the appropriate data sectors on a magnetic disk, for example, to read the requested data, the system may also access the check information that is appended to the data field of each sector. The check information typically requires between 4 and 16 bytes and may be appended to a 512 byte data sector, thereby effectively requiring up to 528 bytes of storage capacity to store 512 bytes of data.

This approach of appending the check information to a standard size data field requires that a client user or manufacturer's representative custom format the electronic storage devices used in the modified storage system. Unfortunately, such a custom format has major potential disadvantages to the end user. For example, the storage devices are typically designed around a standard size data field, such as 512 bytes, and are typically factory tested in this standard configuration. Factory testing using a non-standard data field size, such as using a modified 516 or 528 byte sector, is typically very limited if performed at all.

A second major disadvantage to this configuration is the requirement for additional and more complex calculations during the data storage and retrieval processes. Using a modified sector size, such as 516 or 528 bytes, a storage system controller is effectively required to process and store a data structure of unique size and configuration. This may have the effect of forcing the storage system controller to administer operations using both standard and nonstandard data structure sizes, which may result in over-consumption of random access memory (RAM) by allocating memory for larger, uniquely sized data structures when processing only standard size data structures. For example, the storage system controller may be configured to allocate 528 bytes of memory for nonstandard data structure sizes even when only 512 bytes are required to process a standard size data structure. The additional 4 or 16 bytes of allocated memory may be unnecessarily allocated and become unavailable for other operations.

What is needed is a process, apparatus, and system for storing check information in a data storage system that uses standard sector data field sizes. Beneficially, the proposed process, apparatus, and system would allow the data storage system to store and process the check information used in error detection and error correction schemes without requiring nonstandard data field sizes. The proposed process, apparatus, and system would also cause little, if any, degradation of system performance with regard to processing bandwidth and rotational latency of the data storage system.

BRIEF SUMMARY OF THE INVENTION

The present invention has been developed in response to the present state of the art, and in particular, in response to the problems and needs in the art that have not yet been fully solved by currently available electronic data storage systems. Accordingly, the present invention has been developed to provide a process, apparatus, and system for storing check information for stored data on an electronic storage medium using standard sector data field sizes that overcome many or all of the above-discussed shortcomings in the art.

The apparatus for storing data check information on an electronic storage medium using standard sector data field sizes is provided with a logic unit containing a plurality of modules configured to functionally execute the necessary steps of storing, reading, and writing the check information. These modules in the described embodiments include a write module, a read module, a check information module, a check computation module, a check storage module, a check aggregation module, a data check module, and a location check module.

The write module may be configured in one embodiment to process a write request received by the storage device. Similarly, the read module may be configured to process a read request received by the storage device. The check information module in one embodiment includes the check computation module, the check storage module, the check aggregation module, the data check module, and the location check module.

The check computation module may be configured in one embodiment to compute the check information, such as a cyclic redundancy check (CRC), a logical block address (LBA), or a longitudinal redundancy check (LRC) associated with the data stored in the corresponding sector. The check storage module may be configured to store the computed check information, including state information, in a separate sector from the corresponding data, instead of appending the check information to the data. The check aggregation module may be configured to aggregate the check information associated with data stored in multiple sectors. The check storage module then may be further configured to store the aggregated check information in a sector dedicated for check information and separate from the stored data.

The data check module is configured in one embodiment to verify the integrity of the stored data that is being read in response to a read request received by the storage device. Similarly, the location check module may be configured in one embodiment to verify the location of the requested data.

In one embodiment presented, the apparatus for storing data check information on an electronic storage medium using standard sector data field sizes includes an electronic storage medium, a check computation module, and a check storage module. The electronic storage medium may be formatted into sectors, each sector having a data field of standard size. A standard data field size may be 512 bytes or some other binary multiple. The check computation module of the disclosed apparatus may be configured to compute the check information associated with the stored data or with the data requested to be stored on the storage medium. The check storage module may be configured to then store the check information in the data field of a sector that is distinct from the data field and sector in which the associated data is stored.

In a further embodiment, the apparatus for storing the check information may further include a check aggregation module that may be configured to aggregate the check information associated with the data stored in several, distinct sectors. The aggregated check information, for example, may include check information for data stored in 32 individual sectors. In this scenario, if the check information corresponding to the data in a single sector requires 16 bytes of storage capacity, then the aggregated check information for 32 distinct sectors will require 512 bytes (16 bytes for each of the 32 sectors) and may be stored in the data field of a separate sector. The check storage module may be configured to then store the aggregated check information in a single check sector or alternately store independent check information of 16 bytes each in independent sectors, using only 16 bytes of the 512 bytes available in each sector.

A process of the present invention is also presented for storing data check information on an electronic storage medium using standard sector data field sizes. The process in the disclosed embodiments substantially includes the steps necessary to carry out the functions presented above with respect to the operation of the described apparatus.

In particular, the process for storing data check information on an electronic storage medium using standard sector data field sizes includes the steps of formatting the electronic storage medium, computing the check information, and storing the computed check information. The formatting may be performed at the time of manufacture and factory testing, or alternately may occur at a later date as determined by a user. In either case, the formatting results in the creation of standard size data fields, such as 512 bytes, on the electronic storage medium. Computing the check information may be performed by the check computation module and may employ one or more check procedures and result in one or more check identifiers, such as a CRC, an LBA, or an LRC. The check information may also include certain state information. In one embodiment, the check information associated with data stored or to be stored in a sector is computed and temporarily maintained in a storage buffer or cache. The step of storing the check information includes writing the check information from the buffer to an independent sector that might be identified as a check sector. As mentioned above, if the check information requires 16 bytes of storage capacity, for example, it may be written to the data field of a sector with a standard size or capacity of 512 bytes.

In a further embodiment, the check information corresponding to the data stored in multiple sectors may be aggregated, such as by the check aggregation module of the apparatus. This embodiment may provide more efficient use of the available storage capacity in that the aggregated check information, as opposed to independent check information, may all be stored in the data field of a single sector. In the case of 16 byte check information, check information associated with up to 32 data sectors may be stored in a single check sector having a data field with 512 bytes of capacity. In another example using check information requiring only 4 bytes, the aggregated check information in a single check sector may correspond to data stored in up to 128 data sectors.

These features and advantages of the present invention will become more fully apparent from the following description and appended claims, or may be learned by the practice of the invention as set forth hereinafter.

BRIEF DESCRIPTION OF THE DRAWINGS

In order that the manner in which the advantages and objects of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code could be a single instruction, or many instructions, and may even be distributed over several different code segments, among different programs, and across several memory devices. Similarly, operational data may be identified and illustrated herein within modules, and maybe embodied in any suitable form and organized within any suitable type of data structure. The operational data may be collected as a single data set, or may be distributed over different locations including over different storage devices, and may exist, at least partially, merely as electronic signals on a system or network.

Figure 1:
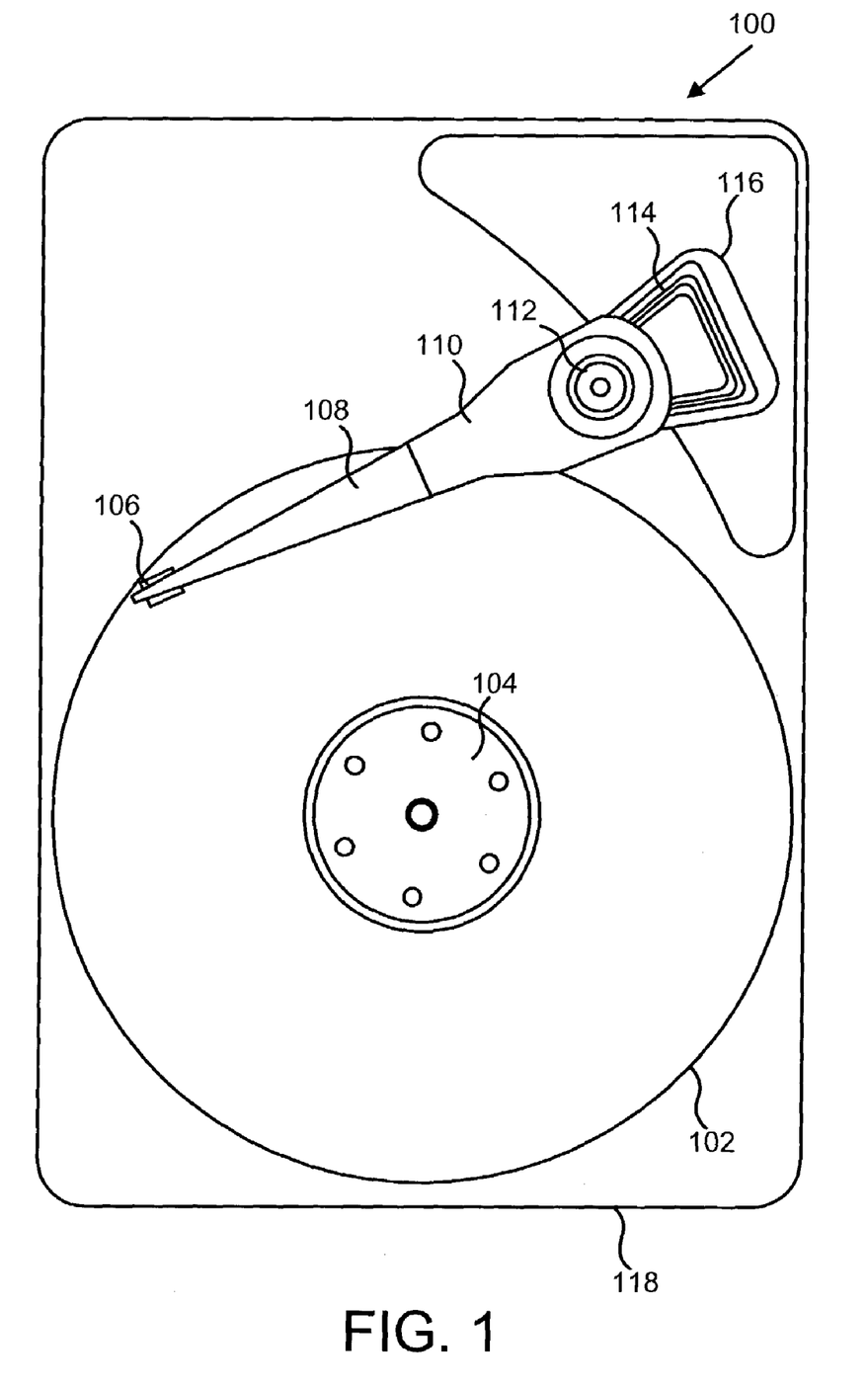
FIG. 1 is a schematic block diagram illustrating a plan view of one embodiment of a representative electronic storage device in accordance with the present invention.

FIG. 1 depicts one embodiment of a representative electronic storage device 100 that is shown in plan view. The device 100 includes an electronic storage media 102 in the form of a magnetic platter. The media 102 is mounted on a spindle hub 104 that allows the media 102 to rotate about a center axis. Data is written to and read from the electronic storage media 102 via a read/write head 106 connected to an actuator suspension 108. The actuator suspension 108 is in turn connected to an actuator arm 110 that is mounted on a rotational axis 112. The actuator assembly, including the read/write head 106, suspension 108, and arm 110, is allowed to move about the rotational axis 112 in response to a magnetic force produced by controlling current flow through the voice coils 114 that are mounted between a pair of permanent magnets 116 (only one magnet shown). As the storage media 102 rotates and the read/write head 106 moves in an arcuate path along the radius of the media 102, a controller (not shown) activates the read/write head 106 to transfer data to and from the media 102.

The storage media 102, hub 104, and actuator assembly, including the read/write head 106, actuator suspension 108, and actuator arm 110, are all mounted within a chassis 118.

Figure 2:
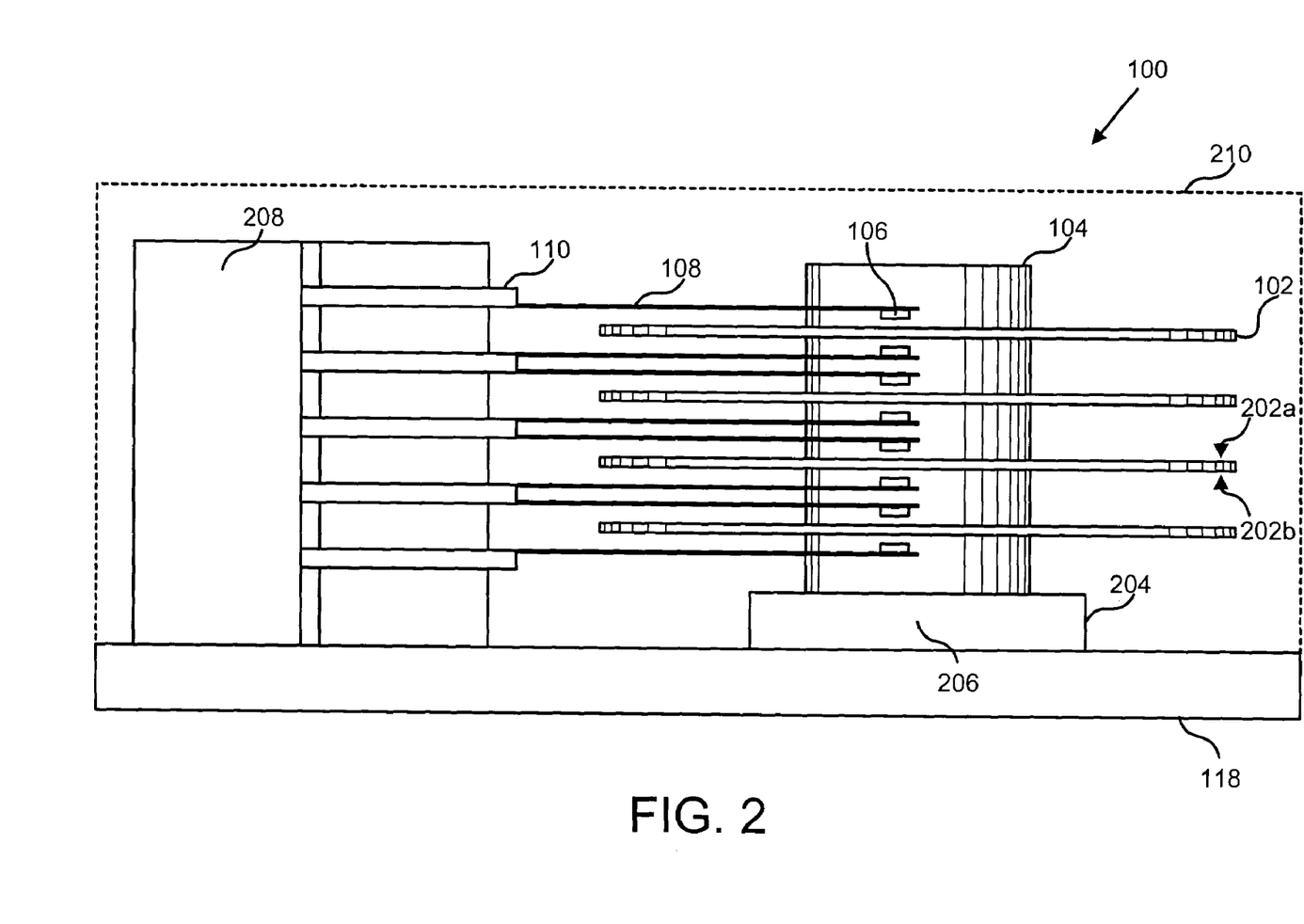
FIG. 2 is a schematic block diagram illustrating a sectional view of one embodiment of a representative electronic storage device in accordance with the present invention.

FIG. 2 depicts one embodiment of a sectional view of the electronic storage device 100. The depicted device 100 shows four individual electronic storage media 102 in the form of magnetic platters. Each platter 102 has a first surface 202a and a second surface 202b. The media 102 are each mounted on the spindle hub 104, which is attached to a spindle motor 204. The spindle motor 204 receives power and control instructions that determine its spin rate. The media 102, hub 104, and spindle motor 204 together make up the disk stack 206.

As in FIG. 1, FIG. 2 also illustrates the actuator assembly. More specifically, FIG. 2 illustrates multiple actuator assemblies, each including a read/write head 106, an actuator suspension 108, and an actuator arm 110. The device 100 includes one read/write head 106 per surface 202a, 202b of each platter 102. As shown, one or more read/write heads 106 and actuator suspensions 108 maybe mounted to a single actuator arm 110. The actuator arms 110 are moved together by the rotary actuator 208, internally including the voice coils 114 and permanent magnets 116, allowing the read/write heads 106 to position over a single cylinder. Cylinders will be discussed further in conjunction with FIG. 3.

FIG. 2 also illustrates the chassis mount 118 as well as an enclosure 210 that is indicated by the dashed line.

Figures 3, 4:
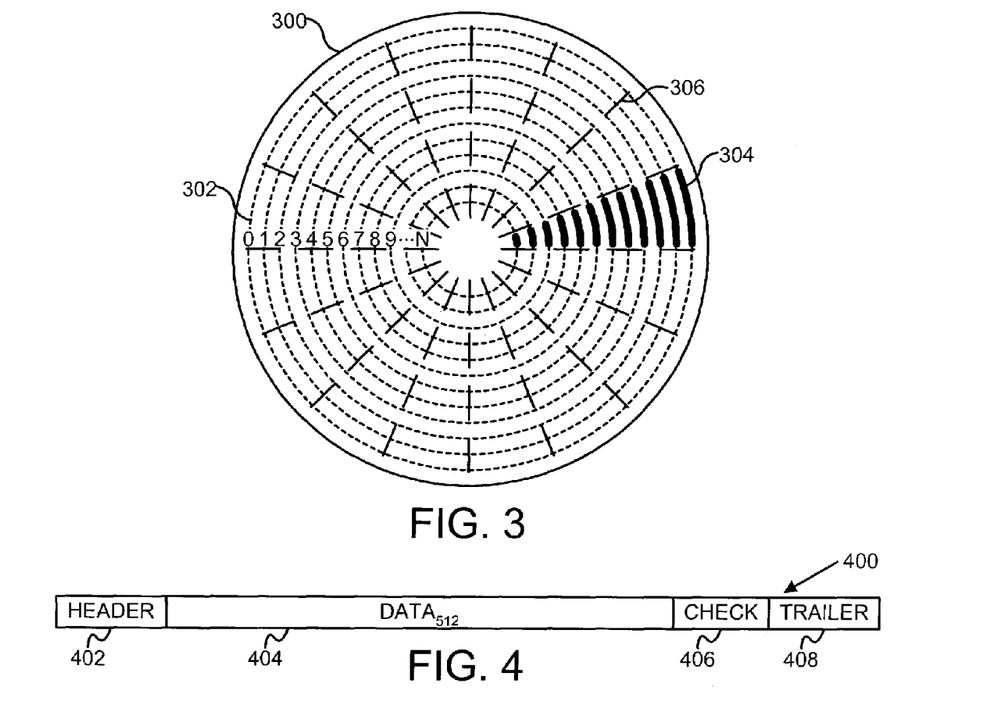
FIG. 3 is a schematic block diagram illustrating one embodiment of a representative formatted electronic storage media in accordance with the present invention.
FIG. 4 is a schematic block diagram illustrating one embodiment of a representative sector data structure in accordance with the prior art.

FIG. 3 depicts one embodiment of a representative electronic storage media surface 300 similar to the surface 202a of the electronic storage media 102 employed in the electronic storage device 100. The illustrated platter surface 300 shows visual demarcations indicating the electronic formatting that may be performed on the media 102.

The depicted surface 300 is formatted to include a plurality of concentric tracks 302, which are numbered 0 through N and are indicated by the concentric dashed circles in the figure. Current technology allows each surface 300 to be formatted to include thousands of tracks 302 per inch and tens of thousands of tracks 302 across the usable surface 300 of the media 102. Individually, each track 302 on each surface 300 of each platter 102 within an electronic storage device 100 is part of a cylinder. A cylinder is a grouping of all similarly numbered tracks 302 from each of the platter surfaces 202a, 202b. For example, track 6 from all of the platter surfaces 202a, 202b together form one cylinder—one track 302 per read/write head 106 for a total of eight tracks 302 in the cylinder.

The platter surface 300 depicted is further segmented into sectors 304, which are shown as darkened segments of the platter surface 300. A sector 304 may be electronically demarcated on the platter surface 300 by an electronic sector gap 306, or possibly by an embedded servo, indicated by the radial dashed lines in the figure. In the depicted embodiment, the platter surface 300 has been segmented into 16 sectors 304 per track 302, for a total of 16 N sectors 304. If N is 11, for example, then the depicted platter surface 300 would be formatted to include 192 sectors 304 using standard recording (12 tracks 302 with 16 sectors 304 per track 302).

A platter surface 300 may alternately be formatted to include zones that define sets of tracks 302. Each zone may be segmented into an increasing number of sectors 304 toward the outer edge of the platter surface 300. Using the depicted embodiment as an example, the tracks 302 numbered 0–3 might be one zone formatted to include 28 sectors 304 per track 302. The tracks 302 numbered 4–7 might be a second zone formatted to include 20 sectors 304 per track 302. The tracks 302 numbered 8-N might be a third zone formatted to include 16 sectors 304 per track 302. This zoned recording would increase the overall number of available tracks 302. Assuming once again that N is 11, zoned recording would allow the platter surface 300 to be formatted to include 256 sectors 304 over the 12 tracks 304 (112 sectors 3034 in the first zone, 80 sectors 304 in the second zone, and 64 sectors 304 in the third zone).

FIG. 4 depicts one embodiment of a typical sector data structure 400 resulting from a formatting process used for an electronic storage device 100. Regardless of the specific track 302 and sector 304 formatting described above, or an alternate thereof, each sector 304 may be individually formatted to include a sector header 402, a data field 404, a check field 406, and a sector trailer 408. The sector header 402 and sector trailer 408 fields may be used to store system information that may indicate the presence of stored data and also help to properly align the read/write heads 106.

The data field 404 is typically used to store data and is formatted to contain a standard number of bytes, such as 512 bytes as indicated by the subscript in the figure. The number of bytes contained in the data field 404 is typically a binary multiple and must be known to the disk controller so that the correct number of bytes can be stored in each data field 404 of each sector 304.

In certain applications, the controller is designed to also write check information to a check field 406 formatted into the sector 302. The check field 406 typically consists of between 4 and 16 bytes and may be used to store cyclic redundancy check (CRC), logical block address (LBA), longitudinal redundancy check (LRC), or other check information or state information.

Figure 5:
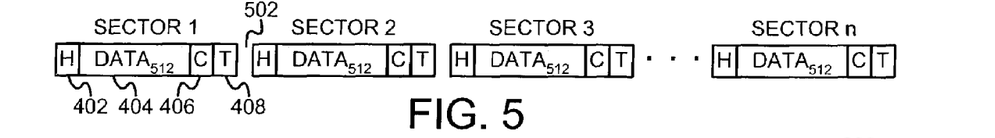
FIG. 5 is a schematic block diagram illustrating one embodiment of a representative series of sector data structures in accordance with the prior art.

FIG. 5 depicts one embodiment of a series of sector data structures 400 that may be from a single track 302. As described above, each sector data structure 400 may contain a sector header 402, a data field 404, a check field 406, and a sector trailer 408. Adjacent sector data structures 400 may be separated by an electronic sector gap 510 that is substantially similar to the electronic sector gap 306 of FIG. 3.

Figure 6:
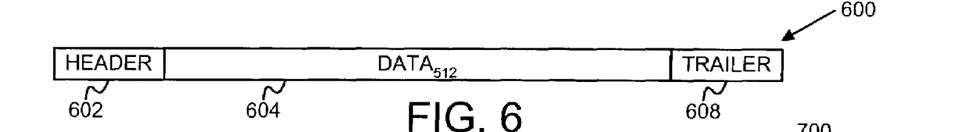
FIG. 6 is a schematic block diagram illustrating one embodiment of a representative sector data structure in accordance with the present invention.

FIG. 6 depicts one embodiment of a sector data structure 600 in accordance with the present invention. The sector data structure 600 is similar to the data structure 400 of FIG. 4, but differs in that the sector data structure 600 does not include a check field similar to the check field 406. The depicted sector data structure 600 does have a sector header 602, a data field 604 of standard size, and a sector trailer 608, but does not include a separate check field. Rather, the check information corresponding to the data stored in the data field 604 of one or more sectors 304 may be stored in the data field 604 of a separate sector 304, as shown in FIG. 7.

Figure 7:
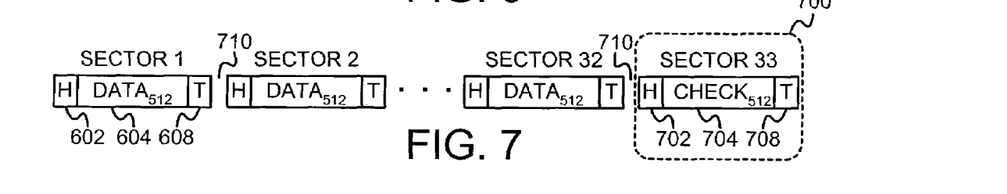
FIG. 7 is a schematic block diagram illustrating one embodiment of a representative series of sector data structures in accordance with the present invention.

FIG. 7 depicts one embodiment of a series of sector data structures 600 in accordance with the present invention. The illustrated data structures 600 may be from a single track and may be separated by an electronic sector gap 710, similar to the gaps 306, 510 shown in FIGS. 3 and 5. In the depicted embodiment, the check information for the data stored in the sectors 304 numbered 1–32 is stored in the data field 604 of the sector 304 numbered 33. The check sector 700, including a sector header 702, a check data field 704, and a sector trailer 708, may be configured to contain all of the check information required for the data stored in the sectors 304 numbered 1–32. The sector header 702 or the sector trailer 706 may include information that specifically designates this sector 302 as a check sector 700. As with the other sectors 304 numbered 1–32, the check sector 700 may be separated from the adjacent sectors 304 by an electronic sector gap 710.

Figure 8:
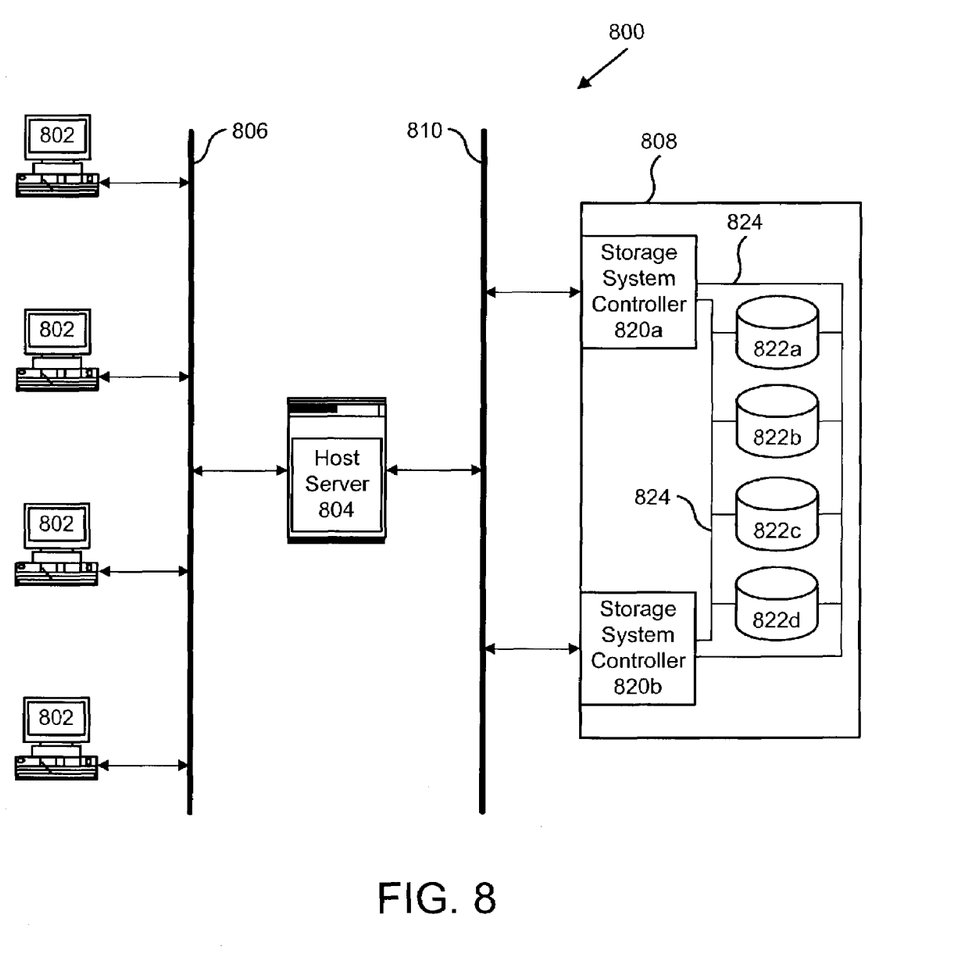
FIG. 8 is a schematic block diagram illustrating one embodiment of a representative RAID network in accordance with the present invention.

FIG. 8 depicts one embodiment of a RAID (redundant array of independent disks) network 800 in which the present invention may be employed for storing data check information using standard sector data field 604 sizes. The illustrated RAID network 800 includes a plurality of client workstations 802 and a host server 804 connected by a local area network (LAN) 806. The host server 804 may be connected to one or more distributed data storage systems 808 by a storage area network (SAN) 810. The storage area network 810 may be embodied in a local area network, a wide area network (WAN), or an alternate configuration. The host server 804 may be connected to the distributed data storage system 808 directly in the absence of a storage area network 810.

The distributed data storage system 808 in one embodiment includes two storage system controllers 820a, 820b that provide redundancy against a possible failure. Alternately, the distributed data storage system 808 may include only one storage system controller 820. In an alternative embodiment, the storage system controller is implemented using software configured to operate on a host. Internal to the distributed data storage system 808 are a plurality of electronic storage devices 822a, 822b, 822c, 822d that are connected to the storage system controllers 820a, 820b via one or more drive interconnect communications channels 824. The electronic storage devices 822a, 822b, 822c, 822d may be substantially similar to the electronic storage device 100 of FIGS. 1 and 2.

Figure 9:
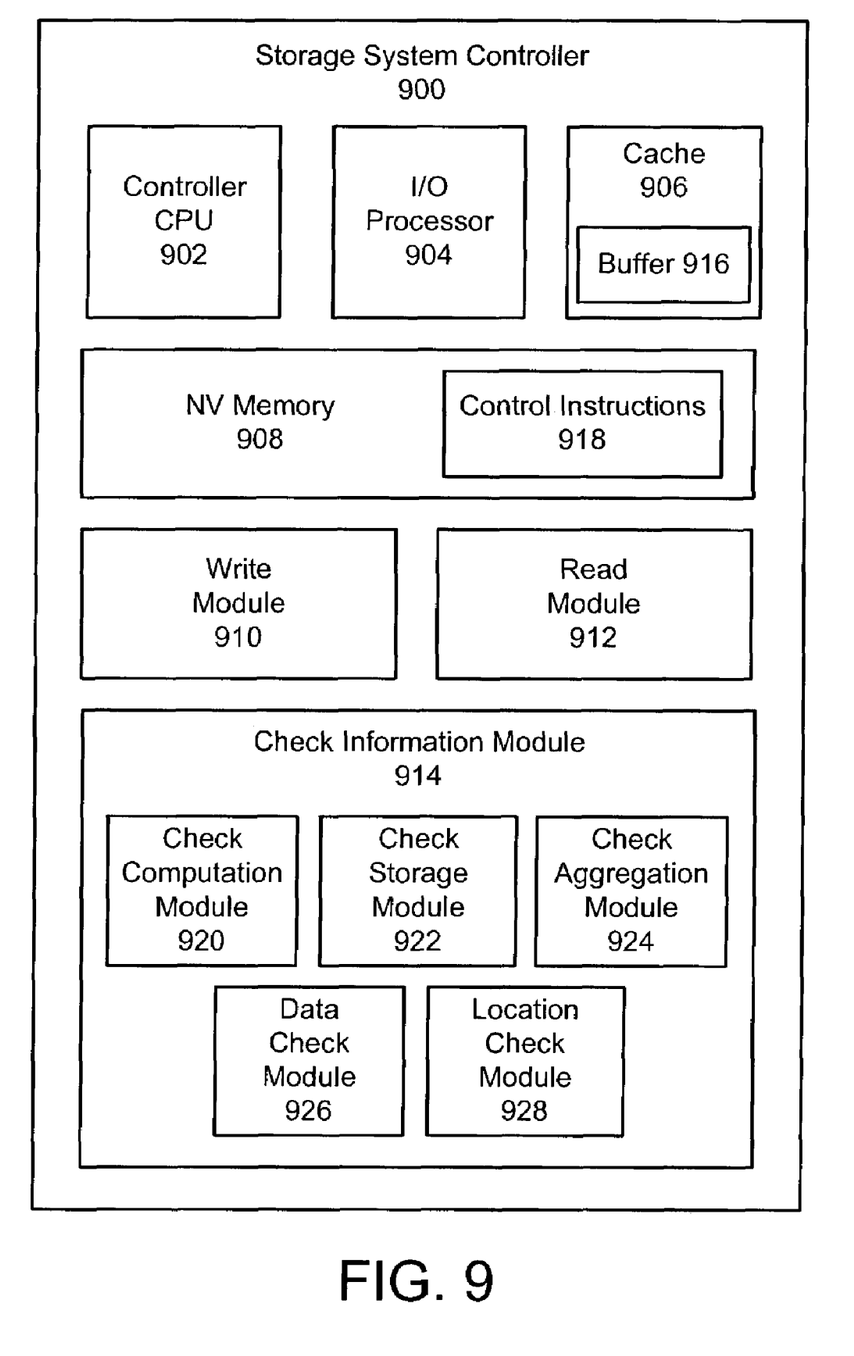
FIG. 9 is a schematic block diagram illustrating one embodiment of a representative storage system controller in accordance with the present invention.

FIG. 9 depicts one embodiment of a storage system controller 900 substantially similar to the storage system controllers 820a, 820b of FIG. 8. The storage system controller 900 includes a central processing unit (CPU) 902, an I/O processor 904, a cache 906, a non-volatile (NV) memory 908, a write module 910, a read module 912, and a check information module 914. In one embodiment, the cache 906 may make storage space available as a buffer 916. The NV memory 908 may include a set of control instructions 918 that contain commands used in the operation of the distributed data storage system 808.

The write module 910 may be configured in one embodiment to process a write request received from a client workstation 802 or from the host 804. Similarly, the read module 912 may be configured to process a read request from a client workstation 802 or from the host 804.

The check information module 914 in the illustrated embodiment includes a check computation module 920, a check storage module 922, a check aggregation module 924, a data check module 926, and a location check module 928. The check computation module 920 is configured in one embodiment to compute the check information, such as a CRC, LBA, or LRC, that corresponds to the data to be stored in the data field 604 of a target sector 304.

The check storage module 922 may be configured to store the computed check information, including state information, in the check data field 704 of the appropriate check sector 700. In one embodiment the check storage module 922 may store the check information that corresponds to the data of a single sector 600, in a single check sector 700. In an alternate embodiment, the check storage module 922 may be configured to operate in conjunction with the check aggregation module 924. The check aggregation module 924 may be configured to aggregate the check information corresponding to the data stored in several sectors 304. The aggregated check information may then be stored by the check storage module 922 in the data field 704 of a single check sector 700.

The illustrated data check module 926 may be invoked by the read module 912 and may be configured to verify the integrity of the data that is being read from a target sector 600. Similarly, the read module 912 may invoke the location check module 928 which is configured in one embodiment to verify the location, including the cylinder, head 106, and sector 304, of the data requested. Similarly, the read module 912 may invoke the location check module 928 which may be configured in an alternate embodiment to verify the location using the LBA.

Figure 10:
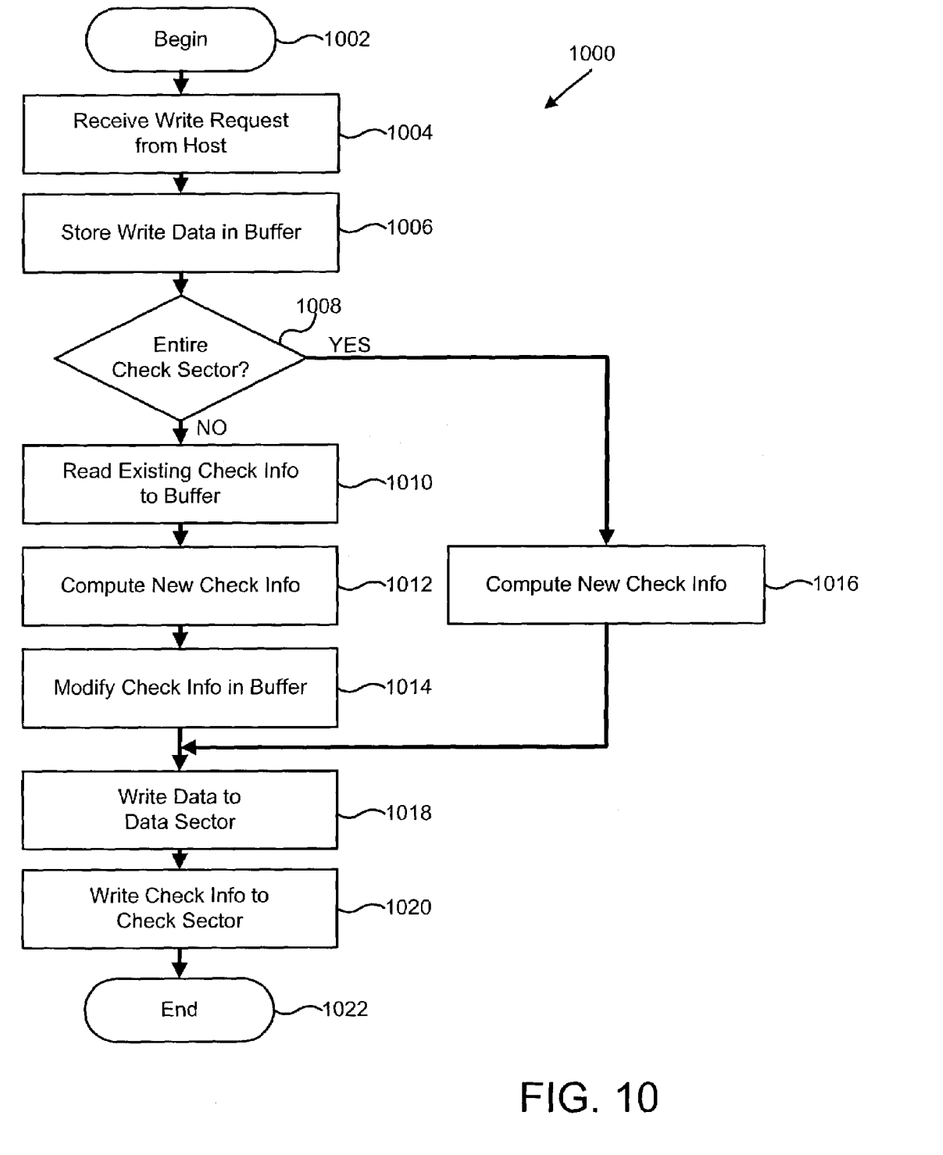
FIG. 10 is a schematic flow chart diagram illustrating one embodiment of a representative write process in accordance with the present invention.

FIG. 10 depicts one embodiment of a representative write process 1000 that may be employed in the depicted RAID network 800 and, in one embodiment, administered by the write module 910 in accordance with the present invention. The process 1000 begins 1002 when the storage system controller 900 receives 1004 a write request from the host 804. The controller 900 then stores 1006 the write data in the buffer 916. The process 1000 then determines 1008 if the check information for the write data will fill an entire check data field 704 of a check sector 700.

If the check information will not fill an entire check sector 700, then the process 1000 reads 1010 the existing check information from the target check sector 700 to the buffer 916. The process 1000 then computes 1012 the new check info and modifies 1014 the check information in the buffer 916. The computation 1012 may be performed by the check computation module 920. The modification 1014 of the check information may include aggregating the check information corresponding to the data stored or to be stored in several individual sectors 600. Such aggregation of check information may be performed by the check aggregation module 924 in the check information module 914.

If the check information will fill the entire data field 704 of a check sector 700, then the process 1000 does not need to read 1010 or modify 1014 any existing check information. The process 1000 does, however, compute 1016 the new check information in a manner substantially similar to the computation step 1012. After computing 1016 the new check information, or after modifying 1014 the check information in the buffer 916, the process 1000 then writes 1018 the data to the data field 604 of the sector 600. The write process 1000 then writes 1020 the new check information to the check data field 704 of the check sector 700. In one embodiment, the check storage module 922 writes 1020 the new check information as described. The write process 1000 then ends 1022.

Figure 11:
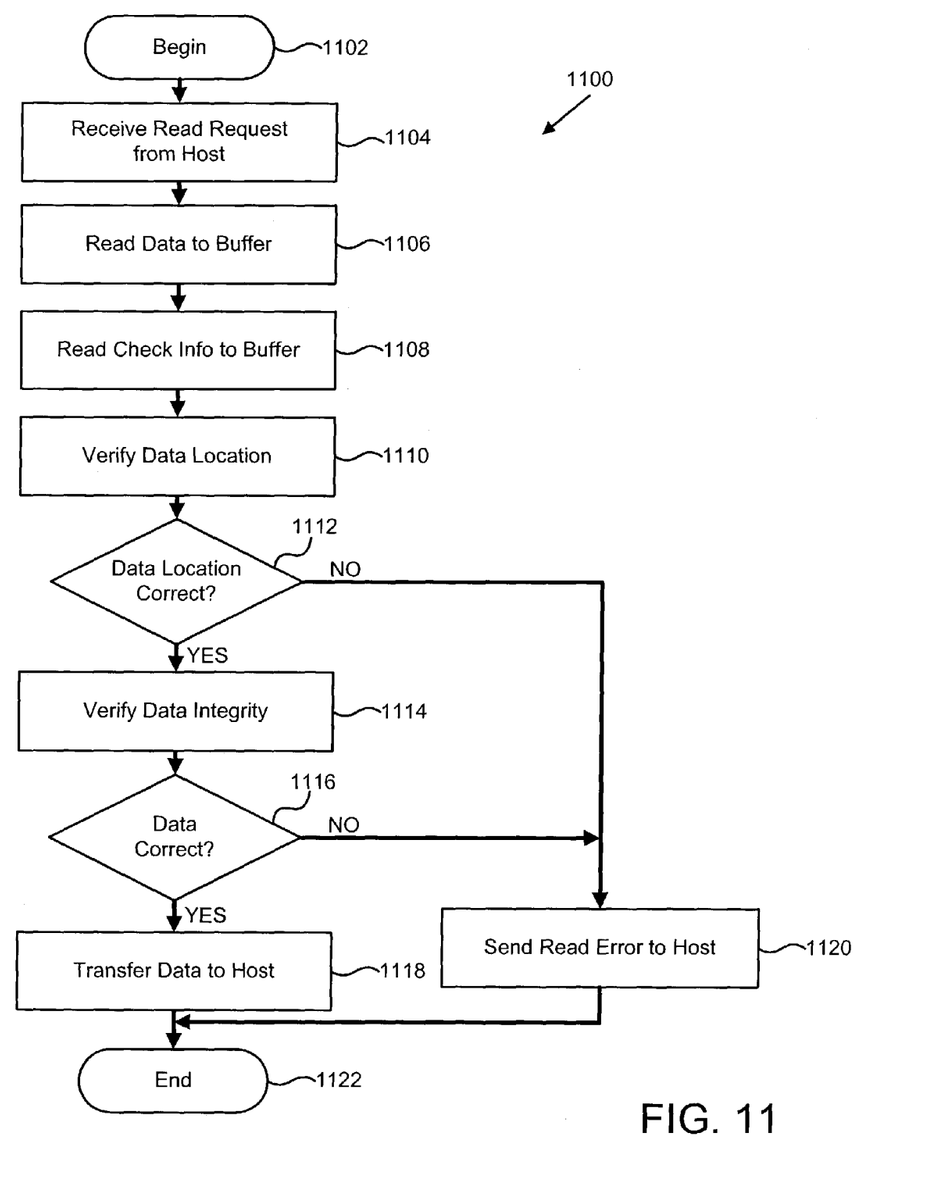
FIG. 11 is a schematic flow chart diagram illustrating one embodiment of a representative read process in accordance with the present invention.

FIG. 11 depicts one embodiment of a representative read process 1100 that may be employed by the depicted RAID network 800 and, in one embodiment, administered by the read module 912 in accordance with the present invention. The read process 1100 begins 1102 when the storage system controller 900 receives 1104 a read request from the host 804. The controller 900 then reads 1106 the target data from the storage media 300 to the buffer 916. The controller 900 also reads 1108 the corresponding check information from the appropriate check sector 700 to the buffer 916.

The read process 1100 then uses the check information copied to the buffer 916 to verify 1110 that the data read 1106 was stored in the correct storage location. The location verification 1110 may be performed in one embodiment by the location check module 926. If the data was in the correct sector 600, then the process 1100 continues and verifies 1114 the integrity of the data read 1106. The data integrity verification 1114 may be performed in one embodiment by the data check module 928. If the data location is determined 1112 to be incorrect or if the data itself is determined 1116 to be incorrect, the process 1100 sends 1120 a read error to the host 804. Otherwise, the process 1100 transfers 1118 the requested data from the buffer 916 to the host 804. After either transferring 1118 the requested data or transferring 1120 a read error to the host 804, the illustrated read process 1100 ends 1122.

What is claimed is:

1. An apparatus for storing data check information using standard sector data field sizes, the apparatus comprising:
   an electronic storage medium formatted into sectors, each sector having a data field of standard size;
   a check computation module configured to compute check information comprising at least a cyclic redundancy check (CRC), a logical block address (LBA), and a longitudinal redundancy check (LRC) and corresponding to data stored in a data field of a first sector, the LBA identifying the intended storage location of the stored data;
   a check storage module configured to store the computed check information in a data field of a second sector that is separate from the first sector;
   a location check module configured to verify, using the LBA, that the stored data is located in the intended storage location; and
   a check aggregation module configured to aggregate the computed check information corresponding to the data stored in each data field of a first plurality of sectors.

2. The apparatus of claim 1, wherein the check storage module is further configured to store the aggregated check information in a second plurality of sectors that are each distinct from and correspond to one of the first plurality of sectors.

3. The apparatus of claim 1, wherein the computed check information comprises a data integrity identifier that is associated with the integrity of the stored data.

4. The apparatus of claim 1, wherein the computed check information comprises a state information that is associated with the stored data.

5. The apparatus of claim 1, further comprising a data check module configured to verify, using a data integrity identifier, that the stored data is not corrupt.

6. An apparatus for storing data check information using standard sector data field sizes, the apparatus comprising:
   an electronic storage medium formatted into sectors, each sector having a data field of standard size;
   a check computation module configured to compute check information comprising at least a cyclic redundancy check (CRC), a logical block address (LBA), and a longitudinal redundancy check (LRC) and corresponding to data stored in a data field of a first sector, the LBA identifying the intended storage location of the stored data;
   the check computation module further configured to compute check information comprising at least a cyclic redundancy check (CRC), a logical block address (LBA), and a longitudinal redundancy check (LRC) and corresponding to a plurality of data stored in a data field of a second sector;
   a check aggregation module configured to aggregate the computed check information corresponding to the data stored in each data field of the first and second sectors;
   a check storage module configured to store the aggregated check information in the data field of a third sector that is separate from the first sector and second sector;

a location check module configured to verify that the stored data is located in the intended storage location; and a data check module configured to verify that the stored data is not corrupt.

7. The apparatus of claim 6, wherein the computed check information comprises a data integrity identifier that is associated with the integrity of the stored data.

8. An electronic storage system for storing data check information using standard sector data field sizes, the system comprising:

a host computer configured to communicate data and operating instructions to an electronic storage device;

an electronic storage system controller configured to receive and process the operating instructions communicated by the host computer to the electronic storage device;

an electronic storage medium formatted into sectors, each sector having a data field of standard size;

a check computation module configured to compute check information comprising at least a cyclic redundancy check (CRC), a logical block address (LBA), and a longitudinal redundancy check (LRC) and corresponding to data stored in a data field of a first sector, the LBA identifying the intended storage location of the stored data;

a check aggregation module configured to aggregate the computed check information corresponding to the data stored in each data field of the first and second sectors;

a check storage module configured to store the computed check information in a data field of a second sector that is separate from the first sector; and a location check module configured to verify, using the LBA, that the stored data is located in the intended storage location.

9. An electronic storage system for storing data check information using standard sector data field sizes, the system comprising:

a host computer configured to communicate data and operating instructions to an electronic storage device;

an electronic storage system controller configured to receive and process the operating instructions communicated by the host computer to the electronic storage device;

an electronic storage medium formatted into sectors, each sector having a data field of standard size;

a check computation module configured to compute check information comprising at least a cyclic redundancy check (CRC), a logical block address (LBA), and a longitudinal redundancy check (LRC) and corresponding to data stored in a data field of a first sector, the LBA identifying the intended storage location of the stored data;

the check computation module further configured to compute check information corresponding to a plurality of data stored in a data field of a second sector;

a location check module configured to verify, using the LBA, that the stored data is located in the intended storage location;

a check aggregation module configured to aggregate the computed check information corresponding to the data stored in each data field of the first and second sectors; and a check storage module configured to store the aggregated check information in the data field of a third sector that is separate from the first sector and second sector.

10. The system of claim 9, wherein the electronic storage system controller is a RAID (redundant array of independent disks) controller.

11. The system of claim 9, wherein the electronic storage system controller is implemented using software that is resident on a host.

12. A process for storing data check information using standard sector data field sizes, the process comprising:

formatting an electronic storage medium into sectors, each sector having a data field of standard size;

computing check information comprising at least a cyclic redundancy check (CRC), a logical block address (LBA), and a longitudinal redundancy check (LRC) and corresponding to data stored in a data field of a first sector, the LBA identifying the intended storage location of the stored data;

storing the computed check information in a data field of a second sector that is separate from the first sector;

aggregating the computed check information corresponding to the data stored in each data field of a first plurality of sectors; and verifying that the stored data is located in the intended storage location using the LBA.

13. The process of claim 12, further comprising storing the aggregated check information in a second plurality of sectors that are each distinct from and correspond to one of the first plurality of sectors.

14. The process of claim 12, wherein computing check information comprises computing a data integrity identifier that is associated with the integrity of the stored data.

15. The process of claim 12, wherein computing check information comprises acquiring state information that is associated with the stored data.

16. The process of claim 12, further comprising verifying, using a data integrity identifier, that the stored data is not corrupt.

17. A process for storing data check information using standard sector data field sizes, the process comprising:

formatting an electronic storage medium into sectors, each sector having a data field of standard size;

computing check information comprising at least a cyclic redundancy check (CRC), a first logical block address (LBA), and a longitudinal redundancy check LRC and corresponding to data stored in a data field of a first sector, the first LBA identifying the intended storage location of the stored data on the first sector;

computing check information comprising at least a cyclic redundancy check (CRC), a second logical block address (LBA), and a longitudinal redundancy check (LRC) and corresponding to a plurality of data stored in a data field of a second sector, the second LBA identifying the intended storage location of the stored data on the second sector;

aggregating the computed check information corresponding to the data stored in each data field of the first and second sectors, the second sectors being separate from the first sector;

storing the aggregated check information in a data field of a third sector; and verifying that the stored data is located in the intended storage location using the first LBA and second LBA.

18. A computer readable storage medium comprising computer readable code configured to carry out a process for storing data check information using standard sector data field sizes, the process comprising:

formatting an electronic storage medium into sectors, each sector having a data field of standard size;

computing check information comprising at least a cyclic redundancy check (CRC), a logical block address (LBA), and a longitudinal redundancy check (LRC) and corresponding to data stored in a data field of a first sector, the LBA identifying the intended storage location of the stored data;

storing the computed check information in a data field of a second sector that is separate from the first sector;

aggregating the computed check information corresponding to the data stored in each data field of a first plurality of sectors; and verifying that the stored data is located in the intended storage location using the LBA.

19. The computer readable storage medium of claim 18, wherein the process further comprises storing the aggregated check information in a second plurality of sectors that are each distinct from and correspond to one of the first plurality of sectors.

20. An apparatus for storing data check information using standard sector data field sizes, the apparatus comprising:

means for formatting an electronic storage medium into sectors, each sector having a data field of standard size;

means for computing check information comprising at least a cyclic redundancy check (CRC), a logical block address (LBA), and a longitudinal redundancy check (LRC) and corresponding to data stored in a data field of a first sector, the LBA identifying the intended storage location of the stored data;

means for storing the computed check information in a data field of a second sector that is separate from the first sector;

means for aggregating the computed check information corresponding to the data stored in each data field of the first and second sectors; and means for verifying that the stored data is located in the intended storage location using the LBA.

21. An apparatus for storing data check information using standard sector data field sizes, the apparatus comprising:

means for formatting an electronic storage medium into sectors, each sector having a data field of standard size;

means for computing check information comprising at least a cyclic redundancy check (CRC), a first logical block address (LBA), and a longitudinal redundancy check (LRC) and corresponding to data stored in a data field of a first sector, the first LBA identifying the intended storage location of the stored data on the first sector;

means for computing check information comprising at least a cyclic redundancy check (CRC), a second logical block address (LBA), and a longitudinal redundancy check (LRC) and corresponding to a plurality of data stored in a data field of a second sector, the computed check information second LBA identifying the intended storage location of the stored data on the second sector;

means for aggregating the computed check information corresponding to the data stored in each data field of the first and second sectors;

means for storing the aggregated check information in a data field of a third sector that is separate from the first sector and second sector; and means for verifying that the stored data is located in the intended storage location using the first LBA and second LBA.

* * * * *